United States Patent
Jeon et al.

(10) Patent No.: US 7,683,706 B2
(45) Date of Patent: Mar. 23, 2010

(54) GAIN AMPLIFIER HAVING SWITCHED-CAPACITOR STRUCTURE FOR MINIMIZING SETTLING TIME

(75) Inventors: Young Deuk Jeon, Daejeon (KR); Young Kyun Cho, Daejeon (KR); Kwi Dong Kim, Daejeon (KR); Jong Kee Kwon, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/195,202

(22) Filed: Aug. 20, 2008

(65) Prior Publication Data
US 2009/0091383 A1 Apr. 9, 2009

(30) Foreign Application Priority Data
Oct. 4, 2007 (KR) .............................. 2007-100004

(51) Int. Cl.
*H03F 1/02* (2006.01)
(52) U.S. Cl. .......................................... 330/9; 327/554
(58) Field of Classification Search ................ 330/9, 330/51, 98, 86; 327/554, 124
See application file for complete search history.

(56) References Cited
U.S. PATENT DOCUMENTS

| | | | | |
|---|---|---|---|---|
| 5,028,893 A | * | 7/1991 | Marrah et al. ................ | 333/173 |
| 6,344,767 B1 | * | 2/2002 | Cheung et al. .............. | 327/336 |
| 6,992,509 B2 | * | 1/2006 | Ko et al. ....................... | 327/96 |
| 7,365,597 B2 | * | 4/2008 | Forbes ........................... | 330/9 |
| 2006/0125676 A1 | | 6/2006 | Kobayashi | |
| 2009/0051421 A1 | * | 2/2009 | Mathe ........................ | 327/554 |

FOREIGN PATENT DOCUMENTS

| JP | 2007-214958 A | 8/2007 |
|---|---|---|
| KR | 1020010039369 A | 5/2001 |

OTHER PUBLICATIONS

Andrew E. Stevens, "A High-Slew Integrator for Switched-Capacitor Circuits", IEEE Journal of Solid-State Circuits, vol. 29, No. 9, Sep. 1994, pp. 1146-1149.

* cited by examiner

*Primary Examiner*—Robert Pascal
*Assistant Examiner*—Hieu P Nguyen

(57) ABSTRACT

Provided is a gain amplifier having a switched-capacitor structure capable of minimizing settling time, in which an input capacitor is connected to an input terminal during a first clock sampling an input signal, and thus an output terminal of the amplifier is reset in advance to an estimated output voltage value rather than 0 by the input capacitor. Accordingly, the slight move of the output terminal of the amplifier is sufficient to settle to a desired value in an amplification mode, so that slewing time can be reduced, and as a result, overall settling time and power consumption can be minimized.

6 Claims, 6 Drawing Sheets

GAIN AMPLIFIER HAVING SWITCHED-CAPACITOR STRUCTURE FOR MINIMIZING SETTLING TIME

CROSS-REFERENCE TO RELATED APPLICATION

This application claims priority to and the benefit of Korean Patent Application No. 2007-100004, filed Oct. 4, 2007, the disclosure of which is incorporated herein by reference in its entirety.

BACKGROUND

1. Field of the Invention

The present invention relates to a gain amplifier having a switched-capacitor structure for minimizing settling time, and more particularly, to a gain amplifier having a switched-capacitor structure capable of resetting its output terminal in advance to an estimated output voltage value rather than 0 when sampling an input signal, to reduce slewing time, so that settling time can be minimized.

The present invention is derived from a project entitled "Elements and Module for Ubiquitous Terminal [2006-S-006-02]" conducted as an IT R&D program for the Ministry of Information and Communication/Institute for Information and Technology Advancement (Republic of Korea).

2. Discussion of Related Art

Recent developments in image sensor technology have led to the embedding of digital cameras in mobile phones. Such image processing systems require a circuit that has low power consumption and is compact in size to enhance portability, among other functions.

In particular, an Analog Front-End (AFE) that processes a low-intensity analog signal output from a sensor uses a two-stage gain amplifier having the switched-capacitor (SC) structure illustrated in FIG. 1 to amplify a signal and to reduce noise.

FIG. 1 illustrates a conventional gain amplifier 100 having a switched-capacitor structure. The gain amplifier includes a two-stage amplifier 110 including two amplifiers, i.e., first and second amplifiers 111 and 112, a first switch SW1, to which an input signal $V_{IN}$ is applied from an input terminal, second and third switches SW2 and SW3, to which a common mode voltage $V_{CM}$ is applied, a sampling capacitor $C_S$ storing the input voltage at a first clock Q1, a miller capacitor $C_M$ for compensating for a frequency of the two-stage amplifier 110, a feedback capacitor $C_F$ connected between an input and an output of the two-stage amplifier 110, a parasitic capacitor $C_P$ connected between the first and second amplifiers 111 and 112 and ground, and a load capacitor $C_L$ connected between an output terminal of the two-stage amplifier 110 and ground.

Describing operations of the gain amplifier 100 according to phases of non-overlapping clocks Q1 and Q2, first, an analog input signal is stored in the sampling capacitor $C_S$ at the first clock Q1, an output voltage $V_{OUT}$ is reset to 0, the second switch SW2 connected to the common mode voltage $V_{CM}$ at the second clock Q2 is turned on, and the charge stored in the sampling capacitor $C_S$ is transferred to the feedback capacitor $C_F$ to determine an output voltage $V_{OUT}$. Here, an output terminal of the amplifier is driven from 0, and a signal is amplified as much as a gain by $C_S/C_F$ values to be output.

That is, the conventional gain amplifier 100 having the switched-capacitor structure stores the input signal in the sampling capacitor $C_S$ at the first clock Q1 using the non-overlapping clocks Q1 and Q2, and then amplifies the signal at the second clock Q2 based on a ratio of the sampling capacitor $C_S$ to the feedback capacitor $C_F$.

However, in the conventional gain amplifier having the above switched-capacitor structure, since the output terminal of the amplifier is always reset to 0 during the first clock Q1 sampling the input signal, the output signal of the amplifier is always driven from 0 to be settled to a desired value during the second clock Q2. This causes slewing time in an amplification mode to be increased, so that overall settling time and power consumption are increased.

SUMMARY OF THE INVENTION

The present invention is directed to a gain amplifier having a switched-capacitor structure capable of reducing slewing time, so that settling time and power consumption can be minimized.

One aspect of the present invention provides a gain amplifier having a switched-capacitor structure for minimizing settling time, including: a first switch, to which an input voltage is applied from an input terminal; a sampling capacitor for storing the input voltage at a first clock; an N-stage amplifier (where N denotes an integer of 2 or greater) for amplifying and outputting the input signal stored in the sampling capacitor at a second clock that does not overlap the first clock; second and third switches for applying a common mode voltage to the N-stage amplifier; a feedback capacitor connected between an input and an output of the N-stage amplifier; an input capacitor connected at one side to the input terminal; a fourth switch for connecting the other side of the input capacitor between an N−1th amplifier and an Nth amplifier of the N-stage amplifier at the first clock; and a fifth switch for connecting the N−1th amplifier of the N-stage amplifier to the Nth amplifier at the second clock.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EMBODIMENTS

The present invention will now be described more fully hereinafter with reference to the accompanying drawings, in which exemplary embodiments of the invention are shown. This invention may, however, be embodied in different forms and should not be construed as limited to the exemplary embodiments set forth herein.

A gain amplifier having a switched-capacitor structure for minimizing settling time according to the present invention will be described in detail below with reference to the accompanying drawings.

Figure 2:
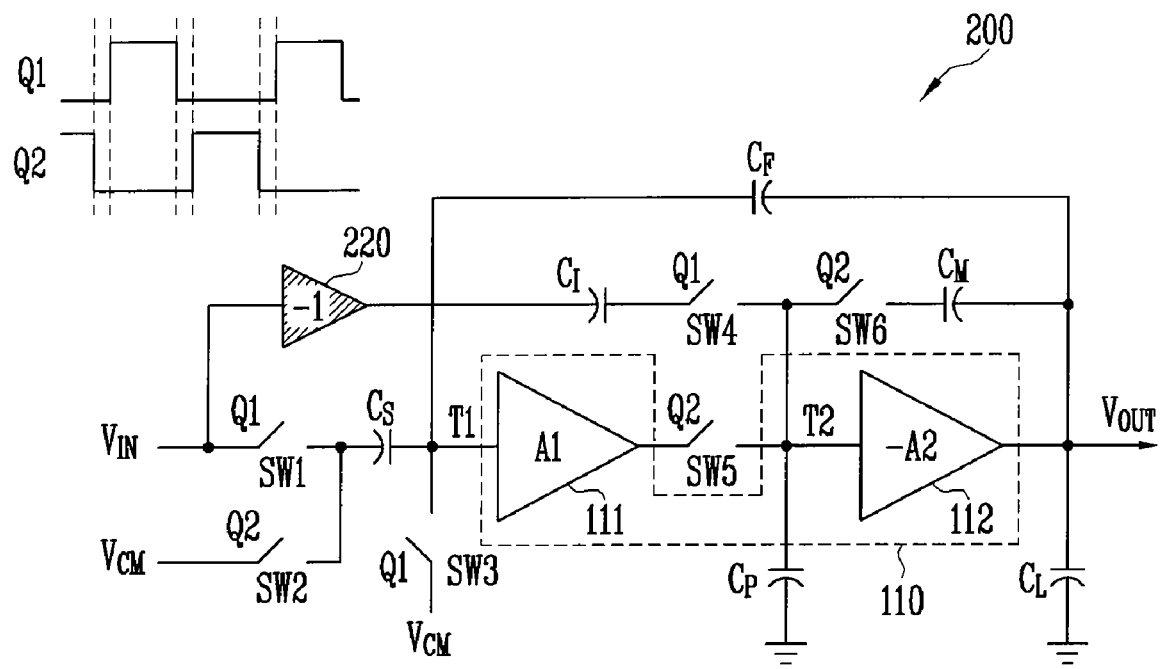
FIG. 2 is a circuit diagram of a gain amplifier having a switched-capacitor structure according to a first exemplary embodiment of the present invention.
Figure 3:
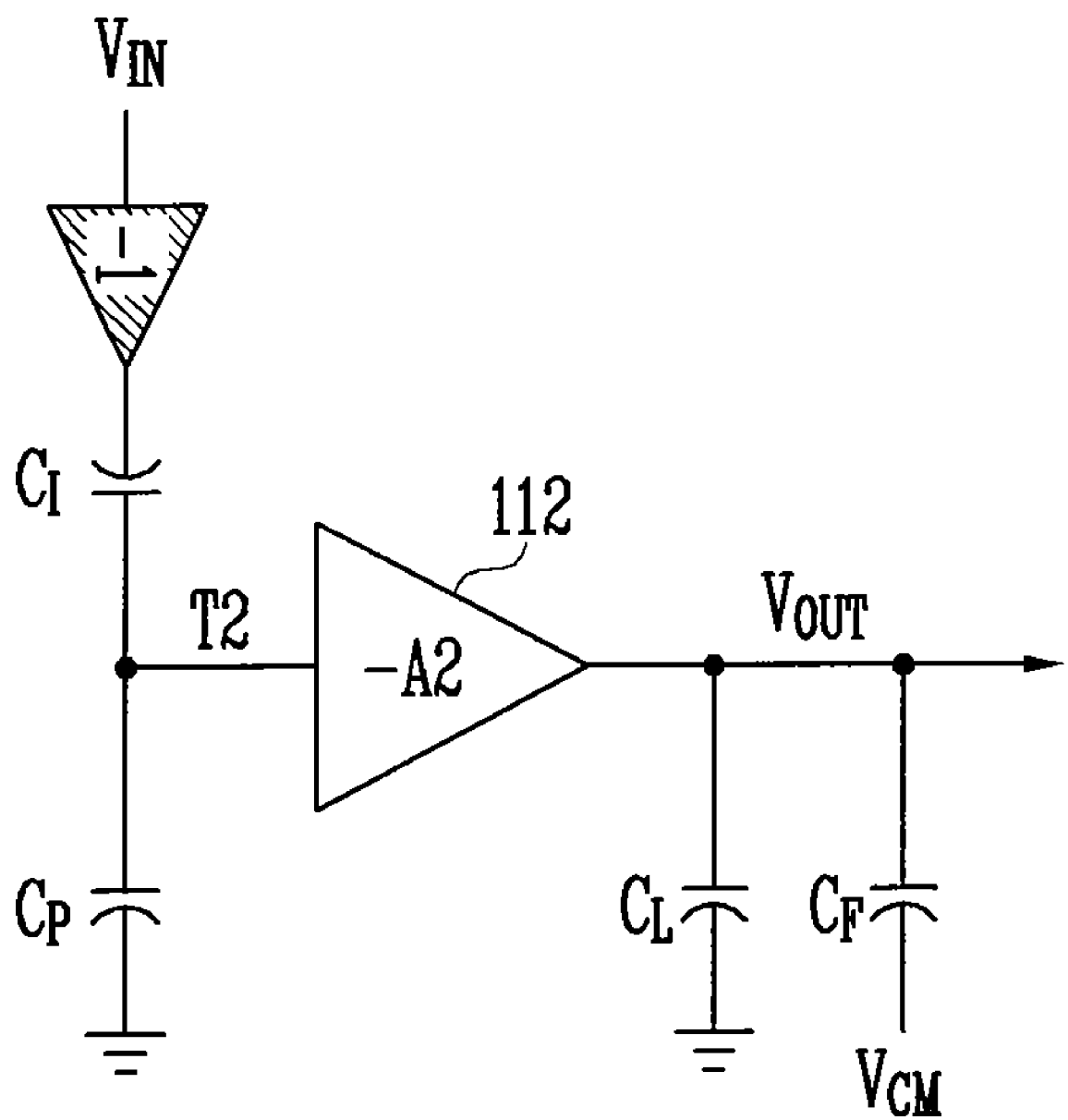
FIG. 3 is an equivalent circuit diagram of a part of the configuration of the gain amplifier illustrated in FIG. 2 when sampling an input signal.

FIG. 2 is a circuit diagram of a gain amplifier 200 having a switched-capacitor structure according to a first exemplary embodiment of the present invention, and FIG. 3 is an equivalent circuit diagram of a part of the configuration of the gain amplifier 200 illustrated in FIG. 2 when sampling an input signal.

Referring to FIG. 2, in the gain amplifier 200 having a switched-capacitor structure according to the present invention, an inverting amplifier 220, an input capacitor $C_I$, and fourth to sixth switches SW4, SW5 and SW6 are added to the conventional gain amplifier 100, and their connections will be described below.

First, the inverting amplifier 220 having a gain of −1 is connected to an input terminal, and the inverting amplifier 220 can be easily implemented by replacing two inputs within a circuit having a differential structure.

Further, one side of the input capacitor $C_I$ is connected to the inverting amplifier 220, and the other side is connected between first and second amplifiers 111 and 112 through the fourth switch SW4 that is open and closed in response to the first clock Q1.

Moreover, the fifth switch SW5 connects the first and second amplifiers 111 and 112 to each other in response to the second clock Q2, and the sixth switch SW6 connects a miller capacitor $C_M$ between an input and an output of the second amplifier 112 in response to the second clock Q2.

Figure 1:
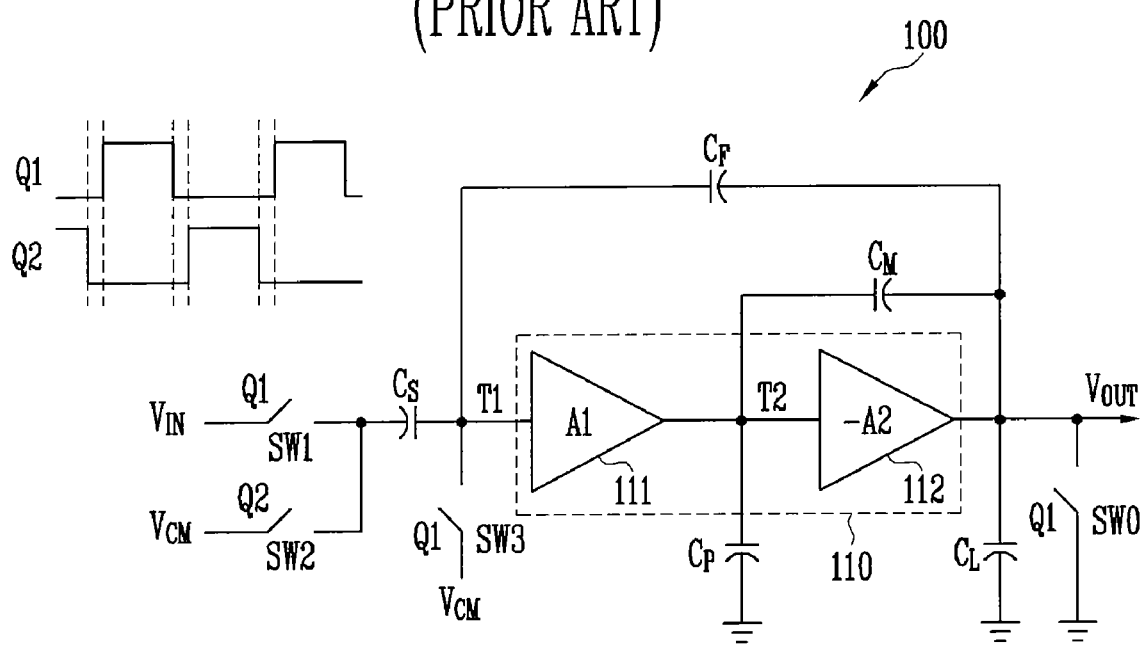
FIG. 1 is a circuit diagram of a conventional gain amplifier having a switched-capacitor structure.

The gain amplifier 200 having the above constitution operates in much the same way as the amplifier 100 of FIG. 1, with the exception of the added circuits, which will be described in detail below.

First, the fourth switch SW4 is turned on at the first clock Q1 sampling an input signal $V_{IN}$, and the fifth switch SW5 and the sixth switch SW6 are turned off. When this is illustrated in an equivalent circuit, as illustrated in FIG. 3, an input capacitor $C_I$, a parasitic capacitor $C_P$, and the second amplifier 112 are sufficient to constitute an amplification circuit at a second node T2, which is an input node of the second amplifier 112.

Therefore, since the input capacitor $C_I$ and the parasitic capacitor $C_P$ are serially connected between the input signal $V_{IN}$ and ground, a voltage $V_{T2}$ of the second node T2 and an estimated output voltage $V_{OUT}$ thereof can be represented by the following Equation 1:

$$V_{T2} = -V_{IN} * C_I/(C_I + C_P)$$

$$V_{OUT} = -A2 * V_{T2} = A2 * V_{IN} * C_I/(C_I + C_P) \quad \text{[Equation 1]}$$

In Equation 1, $V_{IN}$ denotes an input voltage, $C_P$ denotes a value of a parasitic capacitor, $C_I$ denotes a value of an input capacitor, and −A2 denotes a gain value of the second amplifier 112.

It can be confirmed in Equation 1 that the estimated output voltage $V_{OUT}$ with respect to the input signal $V_{IN}$ can be adjusted according to the value of the input capacitor $C_I$.

That is, when the value of the input capacitor $C_I$ is adequately adjusted during the first clock Q1 sampling the input signal $V_{IN}$, to reset in advance an output terminal of the amplifier to the estimated output voltage $V_{OUT}$ rather than 0, the slight move of the output terminal of the amplifier is sufficient to settle to a desired value in an amplification mode, so that slewing time can be reduced. Accordingly, overall settling time and power consumption can be reduced.

Figure 4:
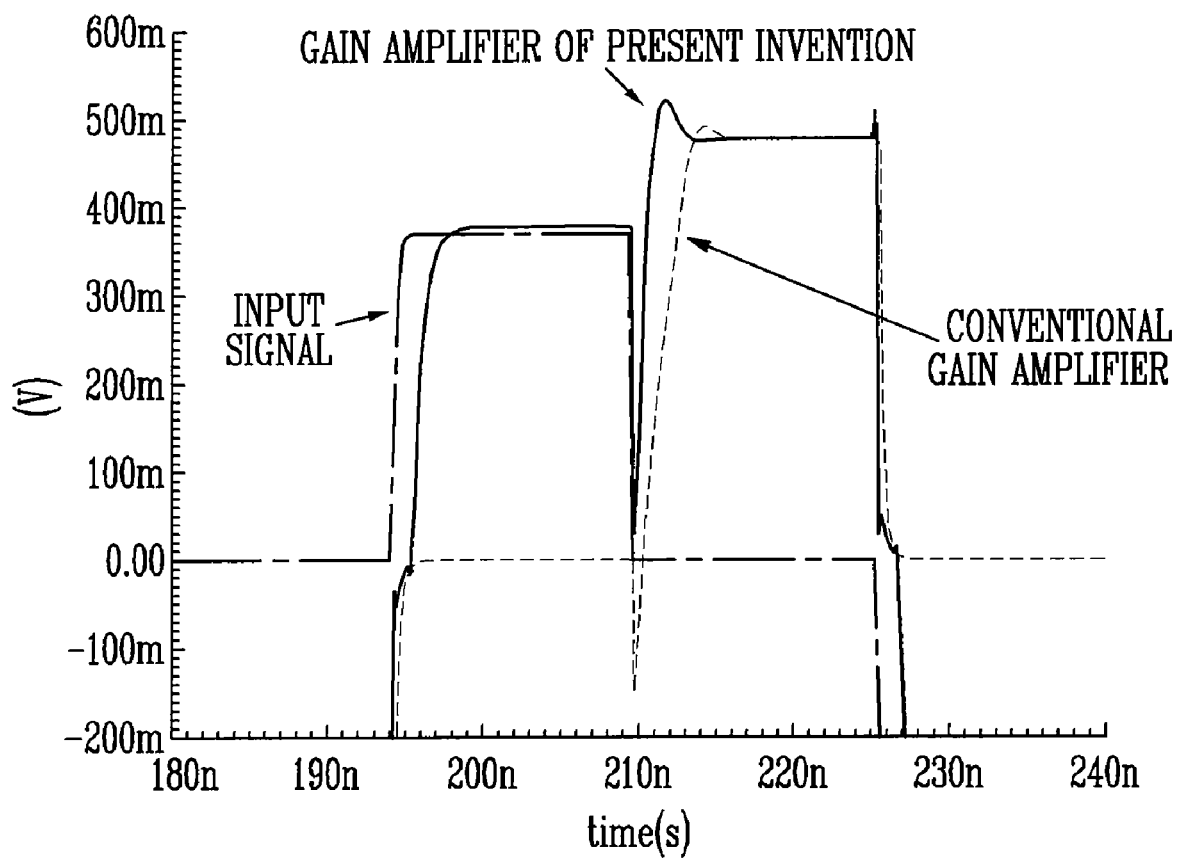
FIG. 4 illustrates simulation results of a gain amplifier according to the present invention and a conventional gain amplifier.
Figure 5:
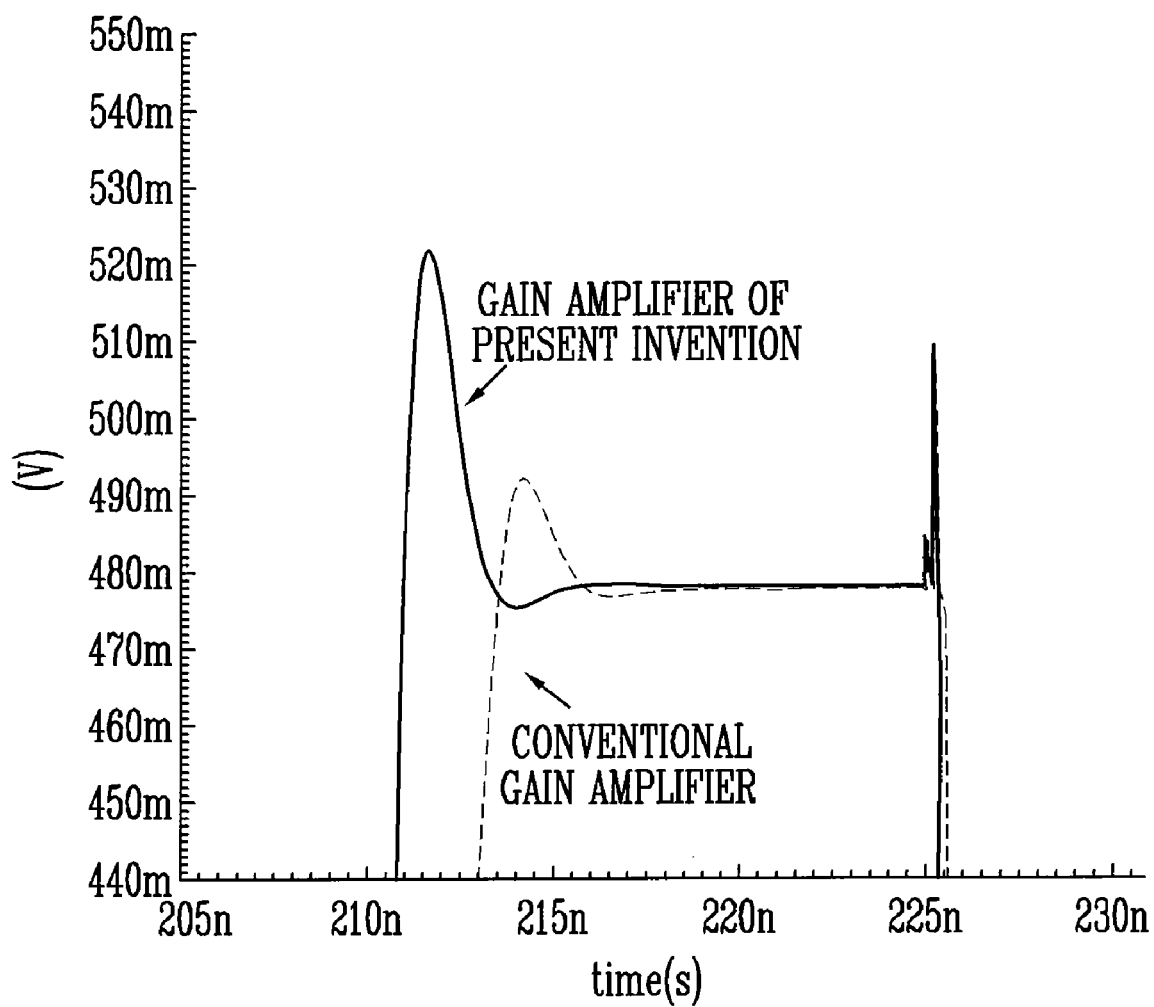
FIG. 5 is an enlarged diagram illustrating an interval where an output signal is settled in FIG. 4.

FIG. 4 illustrates simulation results of a gain amplifier according to the present invention and a conventional gain amplifier, and FIG. 5 is an enlarged diagram illustrating an interval where an output signal is settled in FIG. 4.

As illustrated in FIGS. 4 and 5, with respect to the same input signal (represented in a dotted line), the conventional gain amplifier is reset to 0 when sampling the input signal, and is driven from 0 to a value desired for an output signal in an amplification mode. In contrast, since the gain amplifier of the present invention is reset to an estimated output signal value according to an input voltage when sampling an input signal, it is slightly driven to a desired value from the value reset in an amplification mode. Therefore, compared with the conventional gain amplifier, the output signal of the gain amplifier of the present invention settles 3 ns to 4 ns earlier.

Figure 6:
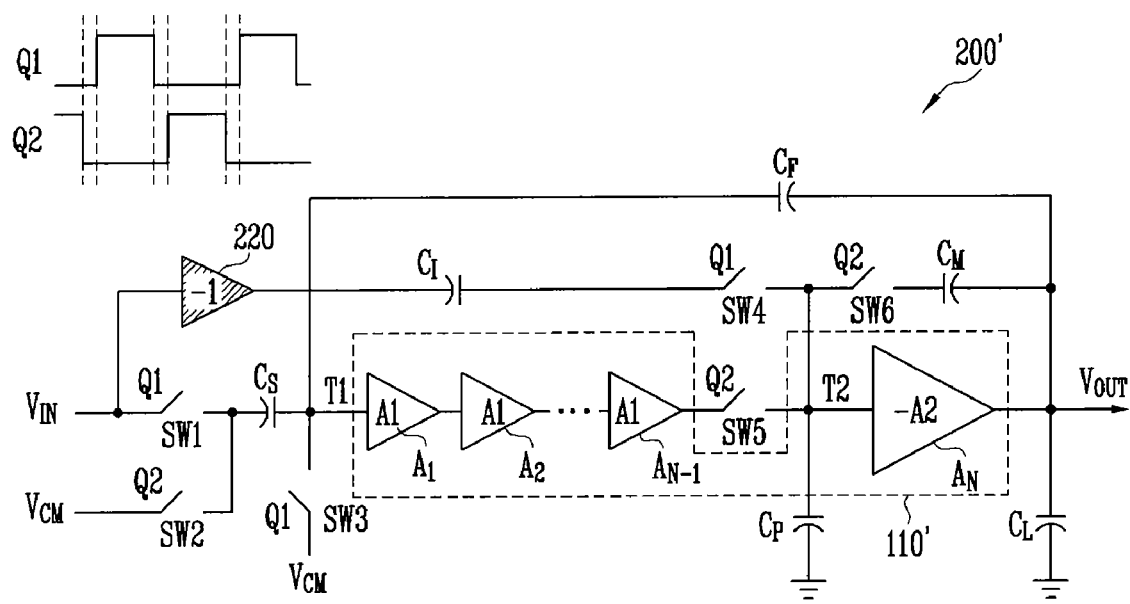
FIG. 6 is a circuit diagram of a gain amplifier having a switched-capacitor structure according to a second exemplary embodiment of the present invention.

FIG. 6 is a circuit diagram of a gain amplifier 200' having a switched-capacitor structure according to a second exemplary embodiment of the present invention. Compared to the gain amplifier 200 of FIG. 2, the only difference is the addition of a multi-stage amplifier 110' in place of the two-stage amplifier 110.

Describing the connections of the multi-stage amplifier 110' in more detail, when the multi-stage amplifier 110' includes N amplifiers, a fifth switch SW5 is connected between a N−1th amplifier $A_{N-1}$ and an Nth amplifier $A_N$, and one side of an input capacitor $C_I$ is connected through a fourth switch SW4. Also, a miller capacitor $C_M$ is connected between an input and an output of the Nth amplifier $A_N$ through a sixth switch SW6.

In the gain amplifier 200', an output terminal of the amplifier is reset in advance to an estimated output voltage $V_{OUT}$ rather than 0, according to the value of the input capacitor $C_I$, during a first clock Q1 sampling an input signal $V_{IN}$. Thus, the slight move of the output terminal of the amplifier is sufficient to settle to a desired value in an amplification mode. As a result, slewing time is reduced so that overall settling time and power consumption may be reduced.

According to the present invention, in a gain amplifier having a switched-capacitor structure, an output terminal of the gain amplifier is reset in advance to an estimated output voltage value rather than 0 when sampling an input signal. Thus, the slight move of the output terminal of the amplifier is sufficient to settle to a desired value in an amplification mode. Accordingly, compared with a conventional gain amplifier, slewing time is reduced so that overall settling time and power consumption are reduced and operating speed and performance are enhanced.

It will be understood by those of ordinary skill in the art that various changes in form and details may be made to the exemplary embodiments without departing from the spirit and scope of the present invention as defined by the following claims.

What is claimed is:

1. A gain amplifier having a switched-capacitor structure for minimizing settling time, comprising:

a first switch to which an input voltage is applied from an input terminal;

a sampling capacitor for storing the input voltage at a first clock;

an N-stage amplifier for amplifying and outputting the input signal stored in the sampling capacitor at a second clock that does not overlap the first clock, wherein N denotes an integer of 2 or greater;

second and third switches for applying a common mode voltage to the N-stage amplifier;

a feedback capacitor connected between an input and an output of the N-stage amplifier;

an input capacitor connected at one side to the input terminal;

a fourth switch for connecting the other side of the input capacitor between an N−1th amplifier and an Nth amplifier of the N-stage amplifier at the first clock; and a fifth switch for connecting the N−1th amplifier of the N-stage amplifier to the Nth amplifier at the second clock.

2. The gain amplifier of claim 1, further comprising a parasitic capacitor connected between the N−1th and Nth capacitors of the N-stage amplifier and ground.

3. The gain amplifier of claim 1, wherein at the first clock, an output voltage of the N-stage amplifier is reset to an estimated output voltage value, according to the input voltage, by the input capacitor.

4. The gain amplifier of claim 3, wherein the estimated output voltage value $V_{OUT}$ according to the input voltage is represented by the following equation:

$$V_{OUT} = -A2 * V_{T2} = A2 * V_{IN} * C_I / (C_I + C_P)$$

wherein $V_{IN}$ denotes an input voltage, $C_P$ denotes a value of a parasitic capacitor, $C_I$ denotes a value of an input capacitor, and $-A2$ denotes a gain value of an Nth amplifier of the N-stage amplifier.

5. The gain amplifier of claim 1, further comprising:

a miller capacitor for compensating for a frequency of the N-stage amplifier; and a sixth switch for connecting the miller capacitor between an input and an output of the Nth amplifier of the N-stage amplifier at the second clock.

6. The gain amplifier of claim 1, further comprising an amplifier having a gain of −1 connected between the input terminal and the input capacitor.

* * * * *